United States Patent [19]

Cordemans De Meulenaer et al.

[11] Patent Number: 4,882,525

[45] Date of Patent: Nov. 21, 1989

[54] METHOD FOR CONTROLLING THE WORKING FREQUENCY OF AN ELECTRO-ACOUSTIC VIBRATING DEVICE

[75] Inventors: Eric Cordemans De Meulenaer, Wezembeek; Baudoin Hannecart, Brussels, both of Belgium

[73] Assignee: Undatim Ultrasonics S.A., Brussels, Belgium

[21] Appl. No.: 238,277

[22] Filed: Aug. 30, 1988

[30] Foreign Application Priority Data

Sep. 14, 1987 [CH] Switzerland ........................ 32542/87

[51] Int. Cl.⁴ ................................................ H01L 41/08

[52] U.S. Cl. ........................................ 310/316; 318/116

[58] Field of Search ................ 310/316, 317; 318/116, 318/118

[56] References Cited

U.S. PATENT DOCUMENTS

| | | | |
|---|---|---|---|
| 3,666,599 | 5/1972 | Obeda | 310/316 X |
| 3,889,166 | 6/1975 | Scurlock | 310/316 X |
| 4,253,036 | 2/1981 | Kizaki | 310/316 |
| 4,525,790 | 6/1985 | Nakamura | 310/316 |
| 4,562,413 | 12/1985 | Mishiro | 310/316 X |
| 4,687,962 | 8/1987 | Elbert | 310/316 |
| 4,689,515 | 8/1987 | Benndorf et al. | 310/316 |
| 4,703,213 | 10/1987 | Gasler | 310/316 |
| 4,736,130 | 4/1988 | Puskas | 310/316 |

FOREIGN PATENT DOCUMENTS

| | | |
|---|---|---|
| 0086739 | 8/1983 | . |
| 0217694 | 4/1987 | European Pat. Off. . |
| 3313918 | 10/1983 | Fed. Rep. of Germany . |
| 2358699 | 2/1978 | France . |
| 2124442 | 2/1984 | United Kingdom . |

*Primary Examiner*—Mark O. Budd

*Attorney, Agent, or Firm*—Young & Thompson

[57] ABSTRACT

One periodically determines the frequency of the vibrating element for which the absorbed power through the ultrasonic device is at a minimum and for which its efficiency is maximum. One compares this frequency to a previously measured frequency and modifies of one step of a given amplitude the working frequency of the ultrasonic device after a given number of comparisons having for result a frequency difference greater than a pre-established value have been detected.

3 Claims, 2 Drawing Sheets

METHOD FOR CONTROLLING THE WORKING FREQUENCY OF AN ELECTRO-ACOUSTIC VIBRATING DEVICE

BACKGROUND OF THE INVENTION

The electro-acoustic vibrating devices, ultrasonic devices or transducers are tools normally used for the realization of chemical manufacturing methods, of machinings by means of abrasive liquids or of weldings. According to their use a working frequency, usually near the resonance frequency of the ultrasonic device, can vary about between 16 and 100 KHz. For all of the applications it is important to define and to maintain during the working of the ultrasonic device working parameters and particularly the vibrating frequency, to values ensuring the best possible efficiency of the ultrasonic device.

BRIEF DESCRIPTION OF THE PRIOR ART

It is known to use auto-oscillating RLC systems in ultrasound generators. One needs then to make a compromise between the working frequency range and the efficiency of the ultrasonic tool which is dependent of the mechanical quality factor Q of the assembly. In fact a moderate Q factor enables work within a relatively large frequency range but with a low efficiency whereas a high Q factor permits work with a good efficiency but in a restricted range of frequencies.

In these known devices, when the system diverges from the mean frequency for working reasons, the generator has to compensate for the loss of efficiency through an increase of the delivered power and this up to a maximum frequency for which the generator is no more able to compensate for the difference in working frequency.

If for any reason the frequency of the ultrasonic device changes, it is necessary that the generator be capable of being continuously tuned on these frequency variations to maintain a good efficiency of the system (high Q factor).

On top of a mechanical device maintaining a fixing position of the vibrating element corresponding to its actual vibration node, it is necessary that the electronic controlling the ultrasounds generator continuously follows the frequency of the emitter to maintain a minimal rate of stationary waves.

Further to the above-mentioned auto-oscillating circuits with their drawbacks, phase locking devices have been used or systems in which the phase difference between the current and the voltage of the circuit is maintained to a maximum value. These systems do not give complete satisfaction since they restrict the possibilities of use of the ultrasonic devices.

SUMMARY OF THE INVENTION

The present invention has for its object a control method of the working frequency of an ultrasonic device obviating the precited drawbacks and the aim of which is to enable the introduction and the modification of numerous parameters acting on the working of the ultrasonic device. This control method for the working frequency of an ultrasonic device is characterized by the fact that one determines periodically the frequency of the vibrating element for which the absorbed power by the ultrasonic device is minimum, or for which its efficiency is maximum; compares this frequency to a previously measured frequency; and modifies one step of a given amplitude the working frequency of the ultrasonic device after a given number of comparisons, the result of which shows a frequency difference greater than a pre-established value have been detected.

BRIEF DESCRIPTION OF THE FIGURES

The attached drawing shows schematically and by way of example a principle circuit of a control device for an ultrasonic device using the method according to the invention (FIG. 1); a complete vibration spectrum of the ultrasonic device (FIG. 2); and a more detailed resonance spectrum (in a more limited frequency range) of this same ultrasonic device (FIG. 3).

DETAILED DESCRIPTION

The present control method of the working frequency of an ultrasonic device comprises the following operations:

1. In a first step, at low power, one makes an excursion in frequency, between pre-established and adjustable limits f min and f max, of the ultrasound generator feeding the ultrasonic device to define the vibration spectrum of the ultrasonic device between these limits. Then one determines the resonance frequency as being the value corresponding to the minimum dissipated energy by calculating the product $V \times I$ of the feeding current and voltage of the ultrasonic device. One can also determine the resonance frequency as being the minimum value of the quotient $V/I$ that is of the impedence of the equivalent circuit representing the ultrasonic device, or by any other adequate means permitting the detection of the resonance.

Figure 2:
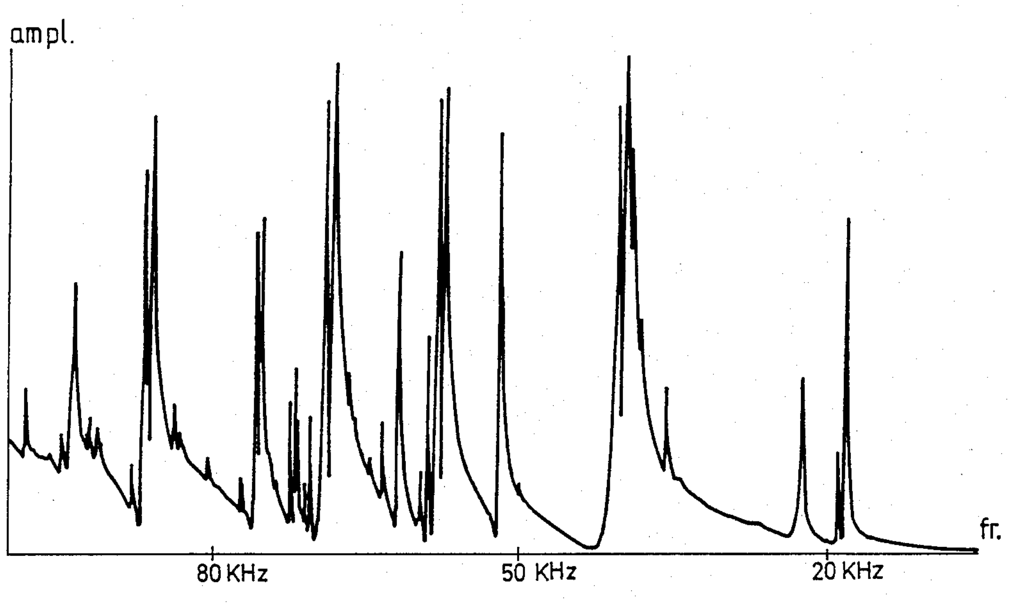
Figure 3:
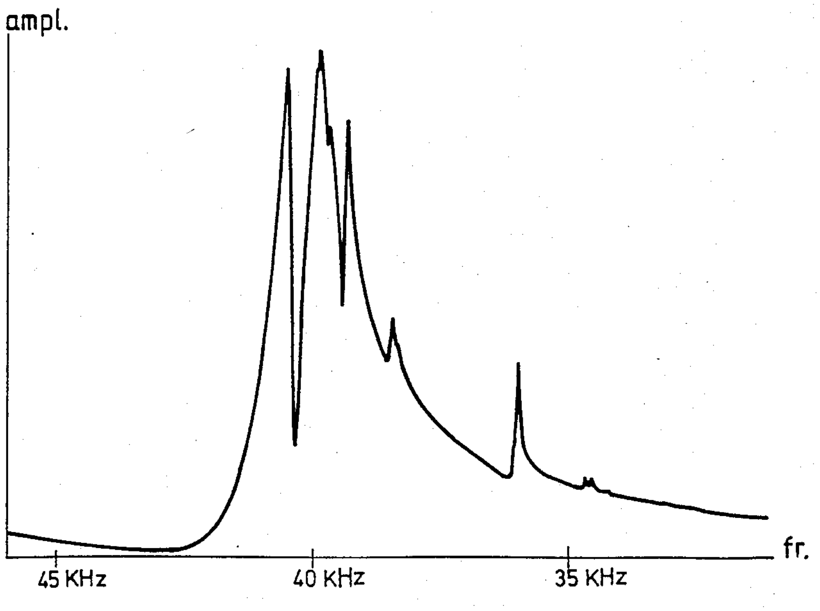

Usually one makes an excursion between the frequencies f min and f max to determine the complete spectrum of the ultrasonic device and to determine the resonance frequency before it is set in power working. This complete spectrum, FIG. 2, shows several frequencies for which the equivalent circuit has a maximum admittance, certain of which can be harmonics of a fundamental one. The operator can thus define which of these characteristic frequencies shall be used for the work of the ultrasonic transducer in function of criterions which depend from the work to be done and in function of the frequency for which the ultrasonic device has been built. He limits then the amplitudes of the subsequent frequencies excursion according to the present method to a restricted frequency range $f1-f2$ including only one of these different frequencies. This is also done when the spectrum of the ultrasonic device is complex, as shown in FIG. 3, always in the aim to limit the frequency excursions between values which are sufficiently proximal the one from the other to include only one maximum of amplitude (resonance).

Furthermore, according to the work done the instantaneous working conditions vary slowly or at the contrary rapidly. That is why the operator has the possibility to modify the time interval separating two successive frequency excursions in order to adapt this parameter to the utilization conditions of the ultrasonic device.

For that first operation, the operator has already the possibility to influence the working conditions of the ultrasonic device by modifying at will three paramaters; the time interval separating two frequency excursions; the frequencies limiting the range within which the frequency excursion is made and/or of course to fix the value of the desired working frequency of the ultrasonic device voluntarily as being equal to its resonance frequency or in certain particular cases as being slightly different from the resonance frequency. In this case the device makes no more periodical frequency excursions.

2. In a second phase, one determines during these frequency excursions the optimum working frequency for which the electro-mechanic transformation is maximum within the pre-established frequency limits.

This determination is made either in calculating the maximum of the product V × I or the minimum of the quotient V/I or any other parameter indicating the resonance. These alternatives are also left to the choice of the operator.

3. One compares, in any appropriate manner, analogically, digitally, by means of a trend analysis, etc.; after each frequency excursion, the optimum calculated working frequency with the previously determined reference frequency. The frequency difference resulting from this comparison is memorized.

4. The reference frequency is modified of one increment of a pre-established value, if a pre-determined number of memorized successive frequency differences are all of a greater value than a given standard difference.

By this latter operation one realizes the control of the reference frequency of the ultrasonic device to its optimum working frequency ensuring thus an optimum efficiency of the ultrasonic device in the particular conditions of use in avoiding any back noise or any parasitic datas.

Here also the operator has the possibility to influence the parameters defining the method particularly by fixing the value of an unitary increment of which the reference frequency can be modified; the number of the successive differences in frequency taken into consideration before making a modification; and the value of the difference in frequencies under which the measured and memorized differences are not taken into account to cause a modification of the reference frequency.

With respect to the known control methods for the working frequency of an ultrasonic transducer the present method is original in the sequence of its step or operations and is very advantageous since it leaves the possibility to the operator to fix numerous parameters entering in the setting in function of the particular condition of use of the ultrasonic device.

Figure 1:
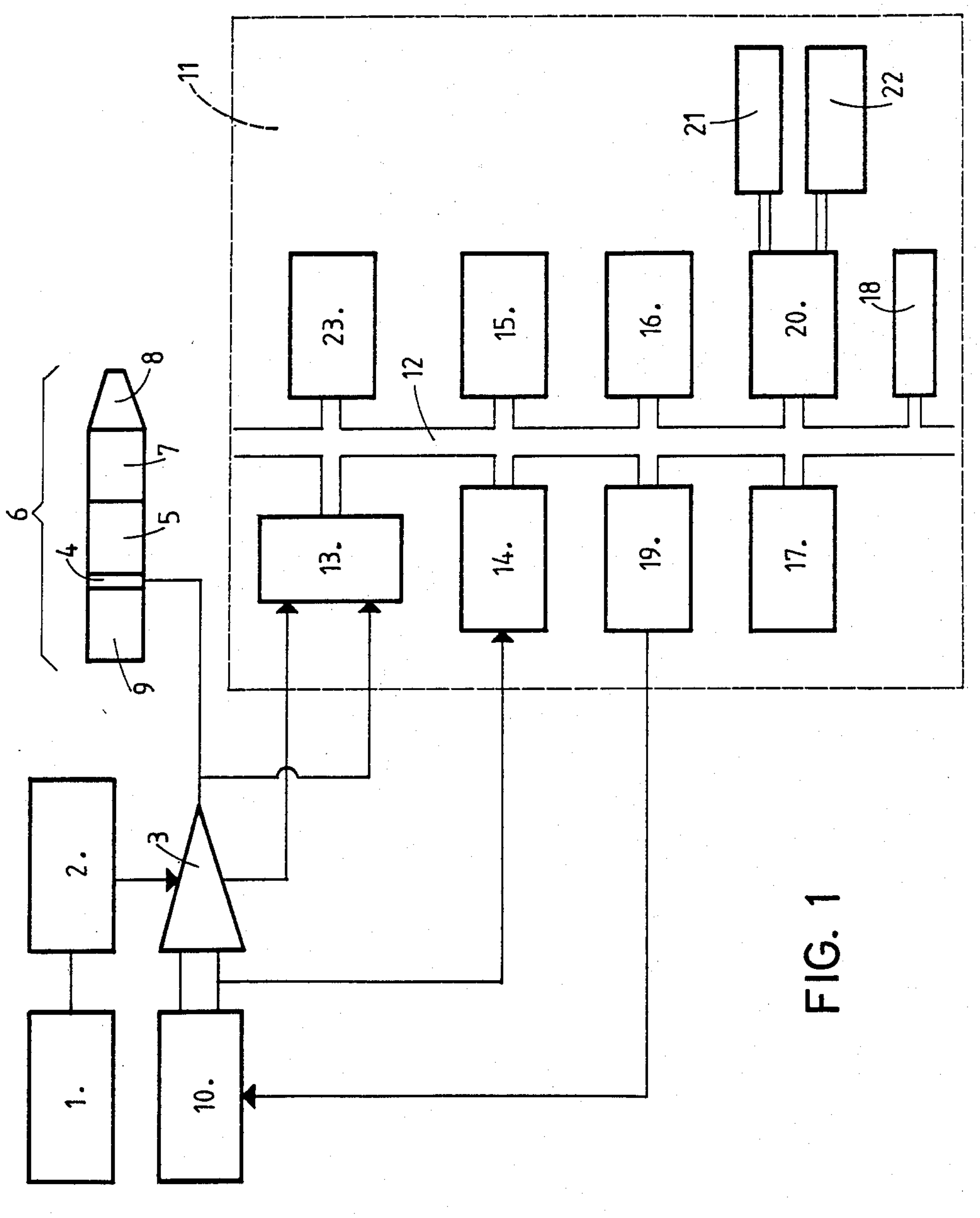

The attached FIG. 1 shows a principal scheme of a device permitting to use the method described for the control of the working frequency of an ultrasonic device.

On this scheme there is provided an electric power source 1 for example at 220 V and 50 Hz which feeds a power regulator 2 driving a power stage or booster 3. This booster 3 feeds the piezoelectric ceramic 4 of the emitter 5 of the ultrasonic transducer or device 6 which comprises further an amplifier 7, a tool 8 and a counterweight 9.

The booster is controlled by a voltage controlled oscillator (V.C.O.) 10 itself driven by a control device 11. This control device 11 is made in the form of a microprocessor having a BUS 12 to which are connected:

An analogue digital converter 13 fed by signals delivered by the booster 3 representing the instantaneous feeding voltage U and current I of the ultrasonic device 6.

A frequency counter 14 fed by a signal delivered by the oscillator 10 corresponding to the instantaneous working frequency of the ultrasonic device.

An interface with display 15 enabling the operator to introduce values for the different controlling parameters of the method.

An interface with display 16 to visualize the method parameters and other chosen values such as the instantaneous frequency etc.

An EPROM memory 17 of the control programme and a RAM memory 18 of its working parameters.

A digital to analogue converter 19 driving, as a result of the operations managed by the control device 11, the frequency of the oscillator 10.

And an interface connected for example to the CNC control 21 of a machine defining its mechanical displacements having to be coordinated with the mask of the ultrasonic device as well as a positioning device 22 of the fixing of the ultrasonic device in function of its working frequency.

Finally, this microprocessor comprises evidently a central control unit CPU 23, as any microprocessor, making the calculations, comparisons and other logical operations necessary to the realization of the method described.

By means of the interface 20 this device permits to act onto the machine on which for example the workpiece to be machined by the ultrasonic device is located. It is therefore possible to automatically control a machining stop, or a setting in stand-by mode, if for any reason the intensity of the current I delivered to the head varies of + 20% per second. One can stop the machining process in the case of a tool breakage.

Of course this microprocessor is also programmed in order that the operator may, by means of the interface 15, impose a fixed working frequency without automatic search of the frequency of the system and cause a manual scanning of the working frequency particularly in order to work, for certain machinings, at a frequency such as the maximum amplitude of the vibration to be located at a precise point of the tool.

We claim:

1. A method for controlling the working frequency of an ultrasonic device, comprising the steps of
   (a) periodically determining the frequency of the vibrating element for which the ultrasonic device power consumption is one of a minimum and for which its efficiency is maximum;
   (b) comparing said determined frequency to a previously measured frequency of said vibrating element for which its power consumption was a minimum;
   (c) repeating said frequency comparison several times;
   (d) measuring the value of the frequency difference at each comparison;
   (e) counting the number of successive comparisons providing as a result a value over a preset, predetermined value; and
   (f) modifying the working frequency of the ultrasonic device of one step of a given frequency amplitude when a predetermined number of successive comparisons have a result over said preset value to adapt said working frequency to new working conditions, whereby said ultrasonic device always works at or near a frequency for which its efficiency is maximum.

2. A method for controlling the working frequency of an ultrasonic device, comprising the steps of
   (a) feeding the device with a given power in a first phase prior to using the device;

(b) producing a frequency excursion of the ultrasonic device within pre-established limits and determining the frequency spectrum of the device as a function of a reference frequency during operation thereof;

(c) producing frequency excursions within pre-established limits around said reference frequency of the device, said excursions being produced at given time intervals;

(d) determining within said limits during said frequency excursions the optimum working frequency for which the electro-mechanical transformation is maximum;

(e) comparing said optimum working frequency with said reference frequency and storing the frequency differences therebetween; and (f) incrementally modifying the value of said reference frequency when a predetermined number of successive frequency differences are greater than a given standard difference.

3. A method for controlling the working frequency of an ultrasonic device, comprising the steps of (a) feeding the device with a given power in a first phase prior to using the device;

(b) producing a frequency excursion of the ultrasonic device within pre-established limits and determining the frequency spectrum of the device as a function of a reference frequency during operation thereof;

(c) producing frequency excursions within pre-established limits around said reference frequency of the device, said excursions being produced at given time intervals;

(d) determining during said frequency excursions one of the minimum value of the quotient V/I and the maximum of the product V × I between the voltage (v) and current (I) feeding the device, said values corresponding with a maximum electro-mechanical transformation within said limits;

(e) defining the optimum working frequency of the device corresponding to the values V/I minimum and V × I maximum;

(f) comparing said optimum working frequency with said reference frequency and storing the frequency differences therebetwen; and (g) incrementally modifying the value of said reference frequency when a predetermined umber of successive frequency differences are greater than a given standard difference.

* * * * *